(12) United States Patent
Jeon

(10) Patent No.: US 12,501,768 B2
(45) Date of Patent: Dec. 16, 2025

(54) DISPLAY APPARATUS AND VEHICLE COMPRISING THE SAME

(71) Applicant: LG Display Co., Ltd., Seoul (KR)

(72) Inventor: Sehwan Jeon, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 385 days.

(21) Appl. No.: 17/966,501

(22) Filed: Oct. 14, 2022

(65) Prior Publication Data
US 2023/0157065 A1    May 18, 2023

(30) Foreign Application Priority Data
Nov. 15, 2021    (KR) ........................ 10-2021-0156518

(51) Int. Cl.
| | | |
|---|---|---|
| H01L 51/52 | (2006.01) | |
| B60K 35/00 | (2024.01) | |
| B60K 35/22 | (2024.01) | |
| B60K 35/28 | (2024.01) | |
| B60K 35/60 | (2024.01) | |
| B60K 35/80 | (2024.01) | |
| H10K 50/80 | (2023.01) | |
| H10K 50/84 | (2023.01) | |

(52) U.S. Cl.
CPC ......... H10K 50/868 (2023.02); B60K 35/22 (2024.01); B60K 35/28 (2024.01); B60K 35/60 (2024.01); B60K 35/80 (2024.01); H10K 50/841 (2023.02)

(58) Field of Classification Search
CPC .... H10K 50/868; H10K 50/841; H10K 50/87; H10K 50/00–88; H10K 59/50; H10K 59/40; H10K 59/00–95; H10K 71/00–861; B60K 35/28; B60K 35/60; B60K 35/00; B60K 35/22
See application file for complete search history.

(56) References Cited

U.S. PATENT DOCUMENTS

| | | |
|---|---|---|
| 7,609,339 B2 | 10/2009 | Choi |
| 8,503,122 B2 | 8/2013 | Liu et al. |

(Continued)

FOREIGN PATENT DOCUMENTS

| | | |
|---|---|---|
| CN | 101097343 A | 1/2008 |
| CN | 102307724 A | 1/2012 |

(Continued)

*Primary Examiner* — Steven B Gauthier
*Assistant Examiner* — Rhys Poniente Sheker
(74) *Attorney, Agent, or Firm* — Birch, Stewart, Kolasch & Birch, LLP

(57) ABSTRACT

A display apparatus can include a display panel, a polarizing film disposed on a top face of the display panel, a viewing-angle adjustment member disposed on a top face of the polarizing film, a touch panel disposed on a top face of the viewing-angle adjustment member, and a heat dissipation plate attached to a bottom face of the display panel. The viewing-angle adjustment member can include a first electrode film, a second electrode film, and an electrochromic zone disposed between the first electrode film and the second electrode film. An electrochromic pattern is disposed in the electrochromic zone. Thus, the display apparatus can have a bezel-less or bezel-free shape in which an outer sealing portion of the viewing-angle adjustment member corresponding to a plurality of users is minimized.

22 Claims, 14 Drawing Sheets

(56) References Cited

U.S. PATENT DOCUMENTS

| | | | |
|---|---|---|---|
| 9,229,253 | B2 | 1/2016 | Schwartz et al. |
| 9,500,888 | B2 | 11/2016 | Schwartz et al. |
| 2002/0154379 | A1* | 10/2002 | Tonar ............... B60R 1/088 |
| | | | 257/E33.059 |
| 2020/0050033 | A1* | 2/2020 | Galwaduge .......... G02F 1/1685 |
| 2021/0200050 | A1* | 7/2021 | Saeki ................. E06B 9/24 |
| 2022/0260883 | A1* | 8/2022 | Shin ................. G02F 1/155 |
| 2022/0291780 | A1* | 9/2022 | Kim .................. H10K 59/40 |
| 2024/0369867 | A1* | 11/2024 | Moll ................. G02F 1/1323 |

FOREIGN PATENT DOCUMENTS

| | | |
|---|---|---|
| CN | 103827726 A | 5/2014 |
| CN | 105074543 A | 11/2015 |
| CN | 106019688 A | 10/2016 |
| KR | 10-2007-0001717 A | 1/2007 |
| KR | 10-1058170 B1 | 8/2011 |
| KR | 10-2020-0124962 A | 11/2020 |

\* cited by examiner

DISPLAY APPARATUS AND VEHICLE COMPRISING THE SAME

CROSS-REFERENCE TO RELATED APPLICATION

This application claims priority to and benefit of Korean Patent Application No. 10-2021-0156518 filed on Nov. 15, 2021 in the Republic of Korea, the entire contents of which are hereby expressly incorporated by reference into the present application.

BACKGROUND OF THE DISCLOSURE

Technical Field

The present disclosure relates to a display apparatus, and more particularly, to a display apparatus having a viewing-angle control function.

Description of Related Art

Recently, as the world enters the information age, a display that visually expresses an electrical information signal has developed rapidly. In response thereto, various display apparatuses providing excellent performance, thinness, light weight, and low power consumption have been developed.

Specific examples of such a display apparatus include a liquid crystal display apparatus (LCD), an organic light-emitting display apparatus (OLED), and a quantum dot display apparatus.

A self-luminous display apparatus such as the organic light-emitting display apparatus is being considered as competitive applications in order to achieve compactness and vivid color display without requiring a separate light source.

Recently, the organic light-emitting display apparatus has been used as means for vehicle information display. In this regard, the organic light-emitting display apparatus can be used as a dashboard in front of a driver. Furthermore, the organic light-emitting display apparatus can be mounted on a center fascia and thus can be used as a center information display (CID). Further, the organic light-emitting display apparatus can be mounted on a dashboard in front of the passenger and thus can be used as AID (ambient information display).

The organic light-emitting display apparatus that can be utilized in this way has a self light-emitting element in each sub-pixel. The self light-emitting element can include two electrodes facing each other and a light emitting layer disposed between the two electrodes facing each other. In such a device, electrons and holes move into the light emitting layer and recombine with each other to emit light.

An organic light-emitting element is a self-luminous element using a thin light-emitting layer between electrodes, and can be embodied as a thin-film. Further, the apparatus is implemented without a separate light source, such that the apparatus can be implemented as a flexible, bendable, and foldable display apparatus, and thus can be designed in various forms.

In the center information display or the ambient information display, several information images can be displayed simultaneously in divided display areas, respectively. For example, an information image used for driving a vehicle such as a navigation image as well as an image for a passenger such as a moving image can be displayed together. In addition, in recent years, a member with a viewing-angle control function can be attached to the display panel to prevent an image intended for the passenger from being visible to the driver or preventing an image intended for the driver from being visible to the passenger. This scheme can be applied to vehicles as well as indoor/outdoor information display apparatuses having a large screen.

However, the viewing-angle adjustment member can be vulnerable to external impact or moisture penetration. The viewing-angle adjustment member is a separate structure other than the display panel. For example, a louver mold can be disposed in the viewing-angle adjustment member so as to partition an electrophoretic ink or an electrochromic pattern. A side sealing portion that protects the louver mold and the electrophoretic ink from an outside can be disposed. When the side sealing portion is cracked or damaged by an external force, external moisture can penetrate therein and thus a concentration of the electrophoretic ink can be lowered or the electrophoretic ink can flow to the outside, resulting in loss of viewing-angle control ability. Therefore, the side sealing portion can contribute to being one of relevant factors in durability of the viewing-angle adjustment member. Thus, the side sealing portion with a sufficient thickness and a sufficient area can cover a side face of the viewing-angle adjustment member to protect the electrophoretic ink and the louver mold.

However, as generations in the development of the display apparatus have progressed, a user has gradually preferred a bezel-less or bezel-free design in which a display area is full sized when viewing a screen. For this reason, a size of the side sealing portion of the viewing-angle adjustment member needs to be reduced for the bezel-less or bezel-free design. A structure in which an outer sealing portion of the viewing-angle adjustment member attached to the display panel is formed in the viewing-angle adjustment member for the bezel-less or bezel-free design can be proposed. Specifically, a partitioning wall or a dam can be formed in the viewing-angle adjustment member, and then a sealing agent can be applied and cured on one face of the partitioning wall, thereby protecting the viewing-angle adjustment member from the outside.

However, during a process of filling the sealing portion of the viewing-angle adjustment member with the sealing agent, the side sealing portion of the viewing-angle adjustment member can be damaged due to an increase in a pressure of the sealing agent.

Moreover, under development of the display apparatus, a reduction of a process time used for production thereof has been recognized as a relevant factor for productivity improvement and profit improvement and thus has been continuously managed. The reduction of the process time can be a relevant factor for productivity improvement of additional members such as modules or optical layers for additional functional improvement of not only the display panel but also the display apparatus. A manufacturing time of the viewing-angle adjustment member and a process time of attaching the member to the display panel can also be relevant factors. In particular, a need to reduce a time needed for application and curing of the sealing agent of the viewing-angle adjustment member to increase production efficiency has been raised.

SUMMARY OF THE DISCLOSURE

The present disclosure is intended to achieve the above purposes or address the needs associated with the related art. A technical purpose of the disclose is to provide a display apparatus in which the pressure of the sealing agent applied to the sealing portion of the viewing-angle adjustment member is lowered to minimize a size of the outer sealing portion of the viewing-angle adjustment member.

Further, a technical purpose of the disclosure is to shorten the application time of the sealing agent of the viewing-angle adjustment member to improve workability thereof.

Thus, a technical purpose of the disclosure is to achieve a fast work speed and remarkably reduce occurrence of defects, regardless of a size or a shape of a display apparatus to which the viewing-angle adjustment member is to be attached.

Purposes of the present disclosure are not limited to the above-mentioned purpose. Other purposes and advantages of the present disclosure that are not mentioned can be understood based on following descriptions, and can be more clearly understood based on embodiments of the present disclosure. Further, it will be easily understood that the purposes and advantages of the present disclosure can be realized using means shown in the claims and combinations thereof.

A display apparatus according to an embodiment of the present disclosure includes a display panel, a polarizing film, a viewing-angle adjustment member, and a touch panel disposed on a top face of the display panel, and a heat dissipation plate attached to a bottom face of the display panel, wherein the viewing-angle adjustment member can include a first electrode film, a second electrode film, and an electrochromic zone and an electrochromic pattern disposed between the first electrode film and the second electrode film.

A display apparatus according to an embodiment of the present disclosure includes a display panel, a polarizing film, a viewing-angle adjustment member, and a touch panel disposed on the top face of the display panel, wherein the viewing-angle adjustment member can include a first electrode film, a second electrode film, a first dam and a second dam disposed between the first electrode film and the second electrode film, and an electrochromic zone and an electrochromic pattern between the first electrode film and the second electrode film.

Specific details of other embodiments are included in the detailed description and drawings.

The display apparatus according to an embodiment of the present disclosure can provide a display apparatus having a bezel-less or bezel-free shape in which a size of an outer sealing portion of the viewing-angle adjustment member corresponding to a plurality of users is minimized.

Further, according to the embodiments of the present disclosure, damage to the sealing portion that may occur when manufacturing the viewing-angle adjustment member can be minimized, thereby improving durability of the apparatus. Specifically, a pressure of the sealing agent applied to the sealing portion can be optimized, thereby reducing damage to the sealing dam. Moreover, the process time of the sealing portion of the viewing-angle adjustment member can be minimized to enable the sealing agent application in a short time.

In the display apparatus according to an embodiment of the present disclosure, the viewing-angle adjustment member corresponding to irregular or various display apparatus in addition to a general display apparatus of a rectangular shape can be efficiently manufactured, thereby reducing the defect thereof.

Effects of the present disclosure are not limited to the above-mentioned effects, and other effects as not mentioned will be clearly understood by those skilled in the art from following descriptions.

The purposes, solutions, and effects of the disclosure as described above does not specify essential features of claims. Thus, the scope of claims is not limited by the purposes, solutions, and effects of the disclosure as described above.

BRIEF DESCRIPTION OF DRAWINGS

The present invention will become more fully understood from the detailed description given hereinbelow and the accompanying drawings which are given by way of illustration only, and thus are not limitative of the present invention.

DETAILED DESCRIPTIONS OF THE EMBODIMENTS

Figure 1:
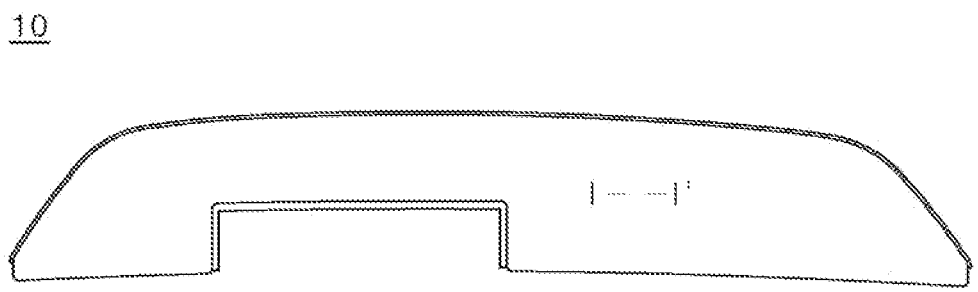
FIG. 1 is a plan view showing a front face of a display apparatus according to an embodiment of the present disclosure.

Advantages and features of the present disclosure, and how to achieve them will become apparent with reference to the embodiments described below in detail in conjunction with the accompanying drawings. However, the present disclosure is not limited to the embodiments as disclosed below, but will be implemented in a variety of different forms. Only these embodiments make the present disclosure complete, and are provided to fully inform those having common knowledge in the technical field to which the present disclosure belongs of a scope of the disclosure. The scope of the present disclosure is only defined by the scope of the claims.

A shape, a size, a ratio, an angle, a number, etc. disclosed in the drawings for illustrating embodiments of the present disclosure are exemplary, and the present disclosure is not limited thereto. The same reference numerals refer to the same elements herein. Further, in describing the present disclosure, when it is determined that a detailed description of a related known element can unnecessarily obscure gist of the present disclosure, the detailed description thereof may be omitted or may be provided briefly. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

In interpreting a numerical value, the value is interpreted as including an error range unless there is no separate explicit description thereof.

It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present. In addition, it will also be understood that when a first element or layer is referred to as being present "on" or "beneath" a second element or layer, the first element can be disposed directly on or beneath the second element or can be disposed indirectly on or beneath the second element with a third element or layer being disposed between the first and second elements or layers.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

In descriptions of temporal relationships, for example, temporal precedent relationships between two events such as "after", "subsequent to", "before", etc., another event can occur therebetween unless "directly after", "directly subsequent" or "directly before" is indicated. The features of the various embodiments of the present disclosure can be partially or entirely combined with each other, and can be technically associated with each other or operate with each other. The embodiments can be implemented independently of each other and can be implemented together in an association relationship. Spatially relative terms, such as "beneath," "below," "lower," "under," "above," "upper," and the like, can be used herein for ease of explanation to describe one element or feature's relationship to another element or feature as illustrated in the figures. It will be understood that the spatially relative terms are intended to encompass different orientations of the apparatus in use or in operation, in addition to the orientation depicted in the figures. For example, when the apparatus in the drawings can be turned over, elements described as "below" or "beneath" or "under" other elements or features would then be oriented "above" the other elements or features. Thus, the example terms "below" and "under" can encompass both an orientation of above and below. The apparatus can be otherwise oriented for example, rotated 90 degrees or at other orientations, and the spatially relative descriptors used herein should be interpreted accordingly.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "display apparatus" can include, in a narrow sense, a display apparatus including a liquid crystal module (LCM), an organic light-emitting diode (OLED) module, or a quantum dot (QD) module including a display panel and a driver for driving the display panel. Moreover, the display apparatus can include, in a broad sense, a laptop computer, a television, a computer monitor, an automotive apparatus or an equipment display for a vehicle, a set electronic apparatus, a set apparatus or a set apparatus including a complete product or a final product including the LCM, the OLED module, or the QD module.

Therefore, the display apparatus in accordance with the present disclosure can include, in the narrow sense, a display apparatus itself including, for example, the LCM, the OLED module, QD module, etc., and can include, in a broad sense, the set apparatus as an application product or an end-user apparatus including a complete product or a final product including the LCM, the OLED module, or the QD module.

Moreover, in some cases, the LCM, OLED module, or QD module composed of the display panel and the driver can be expressed as "display apparatus" in a narrow sense. The electronic apparatus as a complete product including the LCM, OLED module or QD module can be expressed as "set apparatus" in a broad sense. For example, the display apparatus in the narrow sense can include a display panel such as a liquid crystal panel, an organic light-emitting display panel, or a quantum dot display panel, and a source PCB as a controller for driving the display panel. The set apparatus in the broad sense can include a display panel such as a liquid crystal panel, an organic light-emitting display panel, or a quantum dot display panel, a source PCB as a controller for driving the display panel, and a set PCB as a set controller that is electrically connected to the source PCB and controls the set apparatus.

As used herein, the display panel can be of any type of the display panels such as a liquid crystal display panel, an organic light emitting diode (OLED) display panel, a quantum dot (QD) display panel, and an electroluminescent display panel, etc. The display panel used in the disclosure can be not limited to a specific display panel including a flexible substrate for the OLED display panel and an underlying back plate support structure and having a bendable bezel. Moreover, the display panel used in the display apparatus according to an embodiment of the present disclosure is not limited by a shape or a size of the display panel.

More specifically, when the display panel is embodied as the organic light emitting diode (OLED) display panel, the display panel can include a plurality of gate lines and data lines, and pixels respectively formed in areas where the gate lines and the data lines intersect with each other. Moreover, the display panel can be configured to include an array including a thin-film transistor as an element for selectively applying a voltage to each pixel, an organic light-emitting element layer on the array, and an encapsulation substrate or an encapsulation layer disposed on the array to cover the organic light-emitting element layer. The encapsulation layer protects the thin-film transistor and the organic light-emitting element layer from external impact, and can prevent moisture or oxygen from penetrating into the organic light-emitting element layer. Moreover, the light emitting layer formed on the array can include an inorganic light emitting layer, for example, a nano-sized material layer, or a quantum dot. Further, all components of each display apparatus according to all embodiments of the present disclosure are operatively coupled and configured.

FIG. 1 is a plan view showing a front face of a display apparatus 10 according to an embodiment of the present disclosure.

Referring to FIG. 1, the display apparatus 10 represents a display apparatus 10 for a vehicle in which a dashboard area for a driver and a center fascia where various information such as navigation are displayed are integrally formed with each other. However, the disclosure is not necessarily limited thereto. For example, the display apparatus of an embodiment of the present disclosure can be applied to a display apparatus or TV that is disposed indoors and outdoors to provide commercial advertisements or various information. Further, a shape of the display apparatus 10 can conform to various shapes according to purposes and uses of products widely used for vehicles or indoors and outdoors.

Figure 2:
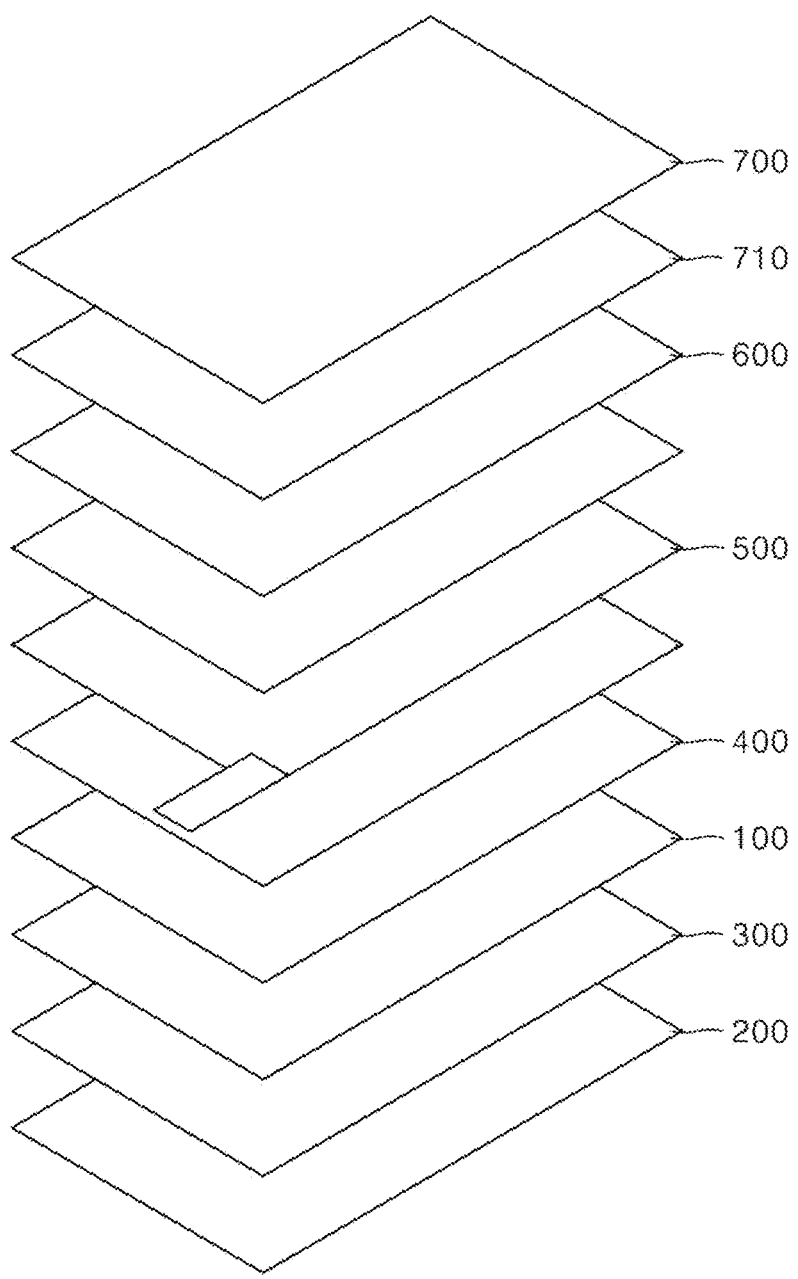
FIG. 2 is an exploded perspective view showing components of the display apparatus of FIG. 1.

FIG. 2 is an exploded perspective view showing components of the display apparatus 10 according to an embodiment of the present disclosure. Based on a back face of the display apparatus 10, a heat dissipation plate 200 embodied as an aluminum plate, a back plate 300, a display panel 100, a polarizing film 400, a viewing-angle adjustment member 500, a touch panel 600, and a cover glass 700 can be stacked in this order. In this way, the display apparatus 10 can be manufactured. However, a stack order thereof is not necessarily limited thereto. For example, the polarizing film 400 can be disposed on a top face of the viewing-angle adjustment member 500 and the touch panel 600 to shield external light in a more reliable manner.

Referring to FIG. 2, the heat dissipation plate 200 can configured to dissipate and disperse heat generated from the display panel 100. For example, the heat dissipation plate 200 can be made of metal. Due to the nature of the metal, the heat dissipation plate 200 can be harder than the display panel 100 and can have high thermal conductivity. When a screen of the display apparatus 10 operates for a long time or a temperature of the display panel 100 rises due to an external temperature rise, a problem related to an operation of the display screen can occur. In order to prevent the operation failure of the display screen, heat dissipation is an important factor. Thus, aluminum or copper plates can be used as the material of the heat dissipation plate 200.

The back plate 300 having a function of supporting the display panel 100 can be disposed on a top face of the heat dissipation plate 200. The back plate 300 can play a role to prevent the display panel 100 from being deformed or damaged during a manufacturing process as the display panel 100 includes a flexible substrate. The back plate 300 can be made of a light and transparent material such as polyethylene terephthalate (PET), or the like.

The display panel 100 can be disposed on a top face of the back plate 300, and the polarizing film 400 can be disposed on a top face of the display panel 100. The display panel 100 will be described in detail in FIG. 3. The polarizing film 400 controls incidence and reflection of external light on and from the display panel 100 to allow the display screen to be visible to the user even outdoors.

When the viewing-angle adjustment member 500 is disposed on a top face of the polarizing film 400, a light portion of having a specific viewing-angle of screen light generated from the display panel 100 can pass therethrough and a remaining portion thereof can be blocked therewith. A function of the viewing-angle adjustment member 500 will be described in detail in FIGS. 4A to 4C.

The touch panel 600 and the cover glass 700 can be disposed on a top face of the viewing-angle adjustment member 500. The touch panel 600 can be built into the display panel 100. However, in this embodiment, a configuration in which a separate touch panel 600 is disposed is be taken by way of example. The cover glass 700 as the topmost layer can protect the display panel 100, the viewing-angle adjustment member 500 and the touch panel 600.

Figure 3:
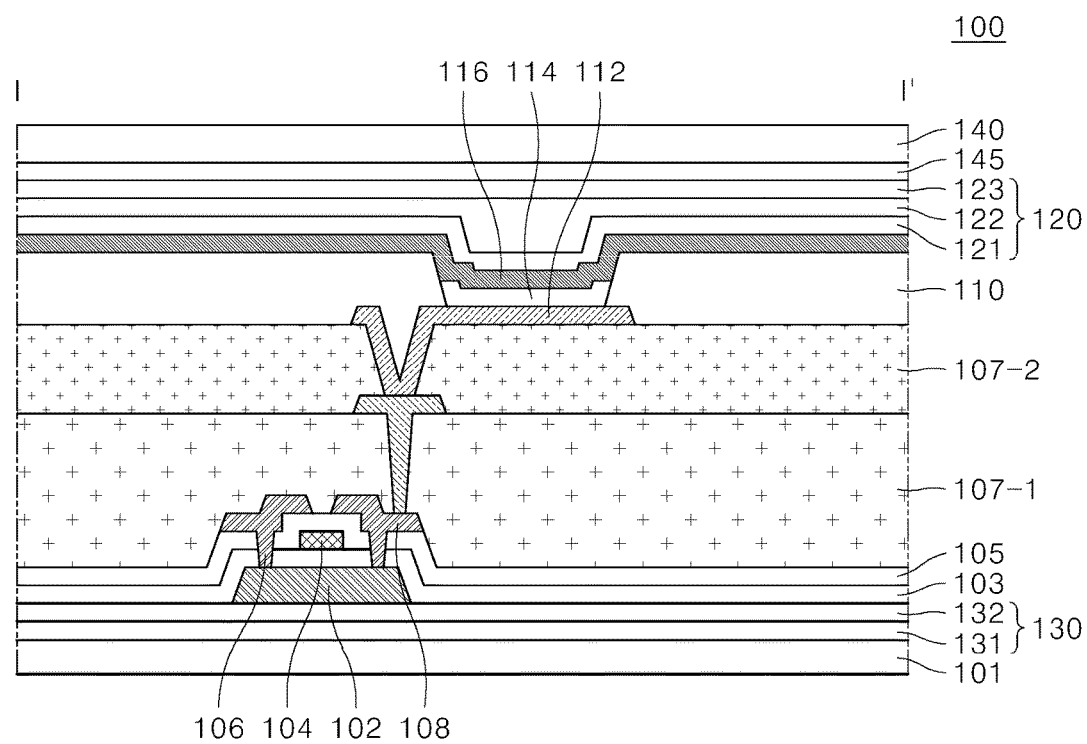
FIG. 3 is a cross-sectional view showing a cross section of a display panel of the display apparatus in FIG. 1.

FIG. 3 is a cross-sectional view of an area taken along I-I' of FIG. 1 as a display area.

Referring to FIG. 3, the display panel 100 has an example structure composed of two planarization layers. In the display panel 100, a semiconductor layer 102, a gate electrode 104, and source and drain electrodes 106 and 108 constituting a thin-film transistor, and an anode electrode 112, an organic light-emitting layer 114, and a cathode electrode 116 are disposed on a substrate 101.

The substrate 101 can be a glass or plastic substrate.

When the substrate is embodied as the plastic substrate, the substrate can be made of a polyimide-based or polycarbonate-based material so as to have flexibility. In particular, polyimide can be applied to a high-temperature process, and is able to be coated, and thus can be often used as a material of the plastic substrate.

The buffer layer 130 acts as a functional layer to protect electrodes/wires from impurities such as alkali ions leaking from the substrate 101 or underlying layers. The buffer layer can be made of silicon oxide ($SiO_x$), silicon nitride ($SiN_x$), or can be composed of multiple layers made thereof. The buffer layer 130 can include a multi buffer layer 131 and/or an active buffer layer 132. The multi buffer layer 131 can be formed by alternately stacking a silicon nitride ($SiN_x$) layer and a silicon oxide ($SiO_x$) layer, and can delay diffusion of moisture and/or oxygen penetrating into the substrate 101. The active buffer layer 132 protects the semiconductor layer 102 of the transistor and prevents various types of defects from the substrate 101 from invading the layers above the buffer layer. The active buffer layer 132 can be made of, for example, amorphous silicon (a-Si).

The thin-film transistor can have a form in which the semiconductor layer 102, the gate insulating film 103, the gate electrode 104, an interlayer insulating film 105, and the source and drain electrodes 106 and 108 are sequentially disposed. The semiconductor layer 102 is disposed on the buffer layer 130. The semiconductor layer 102 can be made of polysilicon (p-Si). In this case, a predetermined area thereof can be doped with impurities. Further, the semiconductor layer 102 can be made of amorphous silicon (a-Si), or can be made of various organic semiconductor materials such as pentacene. Alternatively, the semiconductor layer 102 can be made of oxide. The gate insulating film 103 can be made of an insulating inorganic material such as silicon oxide ($SiO_x$) or silicon nitride ($SiN_x$), or can be made of an insulating organic material. The gate electrode 104 can be made of each of various conductive materials, for example, magnesium (Mg), aluminum (Al), nickel (Ni), chromium (Cr), molybdenum (Mo), tungsten (W), gold (Au), or an alloy thereof.

The interlayer insulating film 105 can be made of an insulating material such as silicon oxide ($SiO_x$) or silicon nitride ($SiN_x$), or can be made of an insulating organic material. Selectively removing the interlayer insulating film 105 and the gate insulating film 103 can allow a contact hole through which the source and drain areas are exposed to be formed.

Each of the source and drain electrodes 106 and 108 can be formed in a form of a single layer or multiple layers and can be made of an electrode material and can be disposed on the interlayer insulating film 105. If necessary, a passivation layer composed of an inorganic insulating material can cover the source and drain electrodes 106 and 108.

A first planarization layer 107-1 can be disposed on the thin-film transistor. The first planarization layer 107-1 protects the thin-film transistor, etc. and has a planarized top face. The first planarization layer 107-1 can be composed of various types of forms and can be made of at least one of acryl-based resin, epoxy resin, phenolic resin, polyamide-based resin, polyimide-based resin, unsaturated polyester-based resin, polyphenylene-based resin, and polyphenylenesulfide-based resin. However, the disclosure is not limited thereto.

Various metal layers serving as wires/electrodes can be disposed on the first planarization layer 107-1.

A second planarization layer 107-2 is disposed on top of the first planarization layer 107-1. The configuration that there are the two planarization layers is due to increase in the number of various signal wirings as the display apparatus 100 evolves toward a higher resolution. Therefore, it is difficult to arrange all the wiring in a single layer while securing a minimum spacing therebetween. Thus, an additional layer is required. Due to this additional layer, for example, the second planarization layer, a space for the wiring can be secured, thus making a wire/electrode layout design easier. Further, when a dielectric material is used as a material of each of the planarization layers 107-1 and 107-2, a metal layer can be disposed between the planarization layers 107-1 and 107-2 for the purpose of generating a capacitance.

The organic light-emitting element can have a structure in which the anode electrode 112, the organic light-emitting layer 114, and the cathode electrode 116 are sequentially disposed. For example, the organic light-emitting element can include the anode electrode 112 formed on the planarization layer 107, the organic light-emitting layer 114 disposed on the anode electrode 112, and the cathode electrode 116 disposed on the organic light-emitting layer 114.

The anode electrode 112 can be electrically connected to a drain electrode 108 of a driving thin-film transistor via a connection electrode. When the organic light-emitting display apparatus 100 is of a top emission type, the anode electrode 112 can be made of an opaque conductive material with high reflectivity. For example, the anode electrode 112 can be made of silver (Ag), aluminum (Al), gold (Au), molybdenum (Mo), tungsten (W), chromium (Cr), or an alloy thereof. The connection electrode can be made of the same material as that of each of the source and drain electrodes 106 and 108.

A bank 110 is formed in a remaining area except for a light-emitting area. Accordingly, the bank 110 has a bank hole defined therein exposing the anode electrode 112 corresponding to the light-emitting area. The bank 110 can be made of an inorganic insulating material such as silicon nitride ($SiN_x$), silicon oxide ($SiO_x$), or an organic insulating material such as BCB, acryl-based resin or imide-based resin.

The organic light-emitting layer 114 is disposed on the anode electrode 112 exposed through the bank hole of the bank 110. The organic light-emitting layer 114 can include a light emitting layer, an electron injection layer, an electron transport layer, a hole transport layer, a hole injection layer, and the like.

The cathode electrode 116 is disposed on the organic light-emitting layer 114. When the display apparatus 100 is of the top emission type, the cathode electrode 116 can be made of a transparent conductive material such as indium tin oxide (ITO) or indium zinc oxide (IZO), such that the light generated from the organic light-emitting layer 114 emits through the cathode electrode 116 upwardly.

An encapsulation layer 120 is disposed on the cathode electrode 116. The encapsulation layer 120 prevents penetration of oxygen and moisture from the outside in order to prevent oxidation of the light-emitting material and the electrode material. When the organic light-emitting element is exposed to moisture or oxygen, pixel shrinkage in which the light-emitting area is reduced can occur or dark spots in the light-emitting area can appear. The encapsulation layer can be composed of an inorganic film made of glass, metal, aluminum oxide ($AlO_x$) or silicon (Si)-based material, or can have a structure in which an organic film and an inorganic film are alternately stacked. The inorganic film plays a role in blocking penetration of moisture or oxygen, while the organic film plays a role in planarization of a surface of the inorganic film. A reason why the encapsulation layer is formed as a thin-film layer composed of multi-layers is to make a movement path of moisture or oxygen longer and more complicated than those in case of a single layer, thus preventing moisture/oxygen from invading to the organic light-emitting element.

Specifically, the encapsulation layer 120 can include a first inorganic insulating film 121, an organic insulating film 122, and a second inorganic insulating film 123. The first inorganic insulating film 121, the organic insulating film 122, and the second inorganic insulating film 123 can be sequentially disposed.

A barrier film 140 is disposed on the encapsulation layer 120 so as to encapsulate an entirety of the substrate 101 and the organic light-emitting element. The barrier film 140 can be embodied as a phase retardation film or an optically isotropic film. When the barrier film has optically isotropic properties, the incident light on the barrier film transmits therethrough without phase delay. Further, an organic film or an inorganic film can be further disposed on a top or bottom face of the barrier film. The organic or inorganic film formed on the top or bottom face of the barrier film serves to block the penetration of external moisture or oxygen.

An adhesive layer 145 can be disposed between the barrier film 140 and the encapsulation layer 120. The adhesive layer 145 adheres the encapsulation layer 120 and the barrier film 140 to each other. The adhesive layer 145 can be made of a heat-curable adhesive or a naturally-curable adhesive. For example, the adhesive layer 145 can be made of a material such as B-PSA (Barrier pressure sensitive adhesive). A touch panel (film), a polarizing film, a top cover, etc. can be further disposed on the barrier film 140.

Figure 4A:
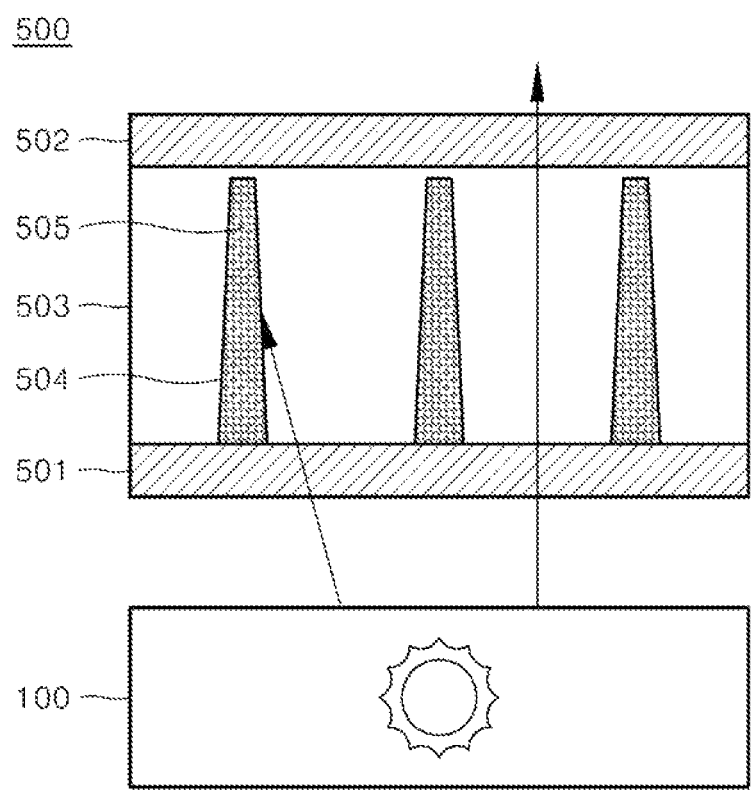
FIG. 4A to FIG. 4C are views of a viewing-angle control process of a viewing-angle adjustment member according to an embodiment of the present disclosure based on modes.
Figure 4B:
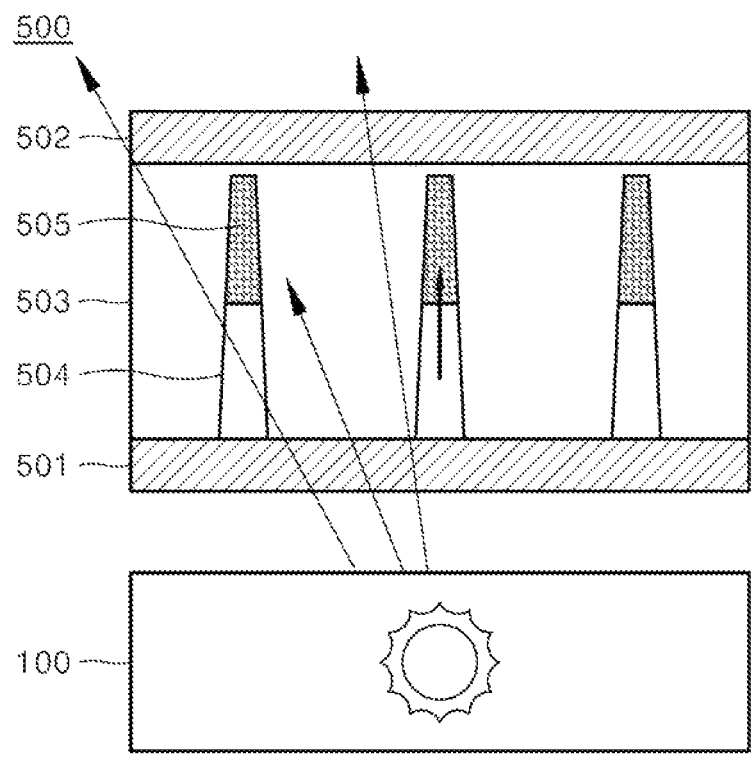
Figure 4C:
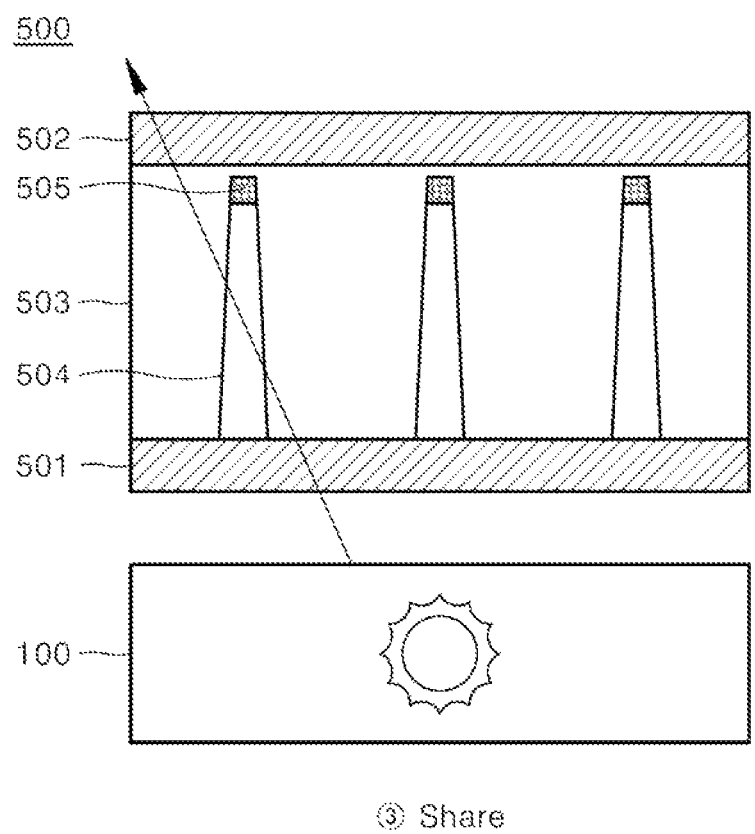

FIG. 4A to FIG. 4C illustrate an operation method of the viewing-angle adjustment member 500 based on modes.

Referring to FIG. 4A, a partitioning wall 503, an electrochromic zone 504, and an electrochromic pattern 505 that are components of the viewing-angle adjustment member 500 can be disposed between a first electrode film 501 and a second electrode film 502 as components of the viewing-angle adjustment member 500. The partitioning wall 503 functions to partition the electrochromic zone 504. The electrochromic pattern 505 is disposed in the electrochromic zone 504. Thus, a distribution area of the electrochromic pattern 505 can be determined based on an electrical signal between the first electrode film 501 and the second electrode film 502. Each of the first electrode film 501 and the second electrode film 502 can be formed by depositing a transparent electrode made of, for example, ITO (Indium Tin Oxide) on one face of the substrate and can have a polarity based on an external electrical signal applied thereto. The substrate of each of the first electrode film 501 and the second electrode film 502 can be made of polyethylene terephthalate (PET) which is transparent and has excellent durability.

A distribution area of the electrochromic pattern 505 in the electrochromic zone 504 can increase or decrease based on a polarity of electricity applied to between the first electrode film 501 and the second electrode film 502. Referring to FIG. 4A, when the electrochromic pattern 505 is evenly distributed in the electrochromic zone 504, the pattern functions as a light blocking wall and allows the light generated from the display panel 100 to travel only in a straight line. The electrochromic pattern 505 can be made of an opaque material, and can be made of a carbon material, such as ink containing a large amount of carbon black, and thus can absorb light. A mode in which the light generated from the display panel 100 travels only in a straight line can be referred to as a privacy mode. The electrochromic pattern 505 can behave in a manner varying based on an electrical signal. In the privacy mode, a negative current can be applied to the viewing-angle adjustment member 500 via the first electrode film 501 and the second electrode film 502. When the negative current is applied thereto, the electrochromic pattern 505 is evenly distributed in the electrochromic zone 504 to preventing the light generated from the display panel 100 from spreading beyond a certain angle.

Referring to FIG. 4B, the electrochromic pattern 505 of the viewing-angle adjustment member 500 can be distributed to a vertical middle level of the electrochromic zone 504, and a portion of the electrochromic zone 504 close to the display panel 100 as a light source may not be filled with the electrochromic pattern 505. This can be referred to as a switching mode. The switching mode can refer to a mode at which the mode of the viewing-angle adjustment member 500 switches from the privacy mode to a sharing mode which will be described in FIG. 4C. However, the disclosure is not necessarily limited thereto. When the switching mode as an intermediate mode between the privacy mode and the sharing mode is selected, the screen can be dimly visible to a user in a side viewing-angle of the display apparatus 10. While the negative current is applied to the viewing-angle adjustment member 500 to achieve the privacy mode, the switching mode can be achieved by setting the current value to zero. In the switching mode, a portion of light can spread at a certain angle in contrast to the privacy mode.

Referring to FIG. 4C, the electrochromic pattern 505 of the viewing-angle adjustment member 500 is distributed only in a top portion of the electrochromic zone 504, and a significant portion thereof can be free of the electrochromic pattern 505. This state can be referred to the sharing mode. Specifically, light generated from the display panel 100 can travel at various angles while the viewing-angle is not limited. Thus, multiple users can view the same screen in the sharing mode.

Figure 5A:
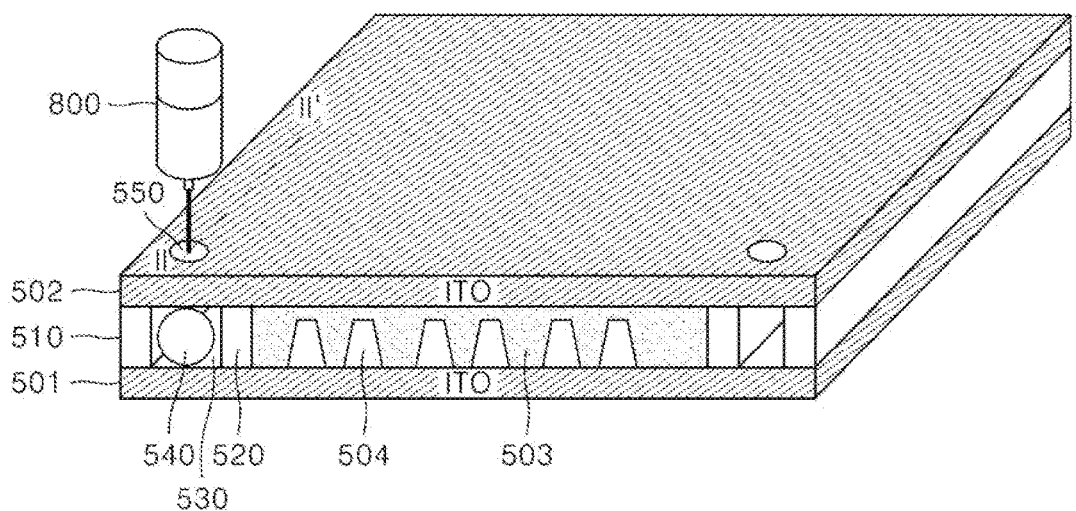
FIG. 5A and FIG. 5B are respectively a perspective view and a cross-sectional view showing an application process of a sealing agent of the viewing-angle adjustment member according to an embodiment of the present disclosure.
Figure 5B:
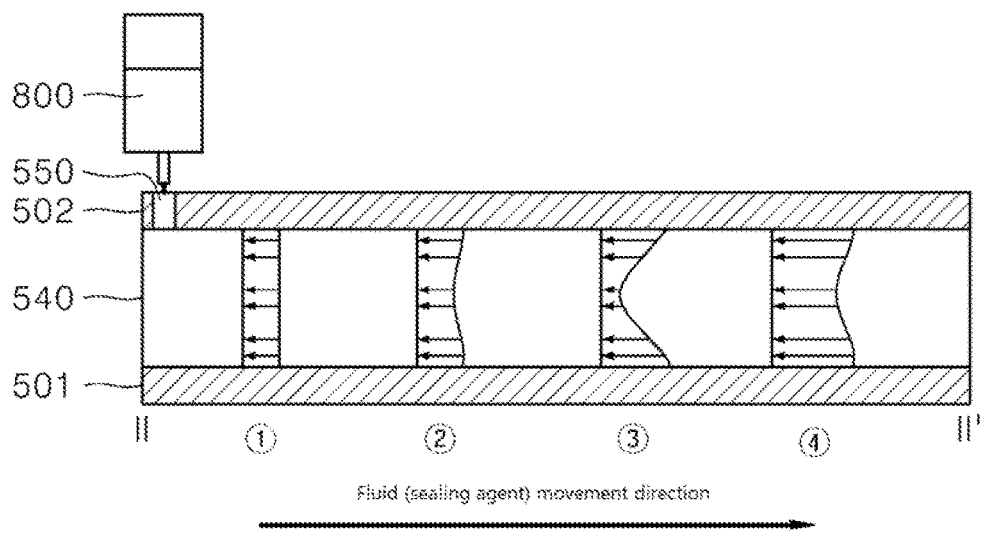

FIG. 5A and FIG. 5B are diagrams showing a first embodiment of injecting a sealing agent 540 into a sealing portion 530 of the viewing-angle adjustment member 500. Although a cross-section of one side is shown to illustrate a process in which the sealing agent 540 is injected into the sealing portion 530, said one side is completely sealed in a real product, so that the sealing agent 540 or the electrochromic pattern 505 does not leak out of the viewing-angle adjustment member 500.

Referring to FIG. 5A, the viewing-angle adjustment member 500 has the partitioning wall 503 and an electrochromic zone 504 in an inner region thereof. The first electrode film 501 and the second electrode film 502 are respectively disposed on a top and a bottom of the partitioning wall 503, so that the viewing-angle adjustment member 500 is be able to operate. A first dam 510 and a second dam 520 are arranged by a regular spacing and are disposed outside of the partitioning wall 503 and the electrochromic zone 504. The sealing agent 540 is injected into the sealing portion 530 formed between the first dam 510 and the second dam 520 to seal the sealing portion. In the first embodiment, about two injection holes 550 are formed in the second electrode film 502 such that the sealing agent 540 is injected through the holes 550 from a sealing agent injection nozzle 800. The injected sealing agent 540 flows along an outer edge of the viewing-angle adjustment member 500 and completely surrounds the viewing-angle adjustment member 500, and is cured for encapsulation thereof. Since the first embodiment only needs to form a minimum number of injection holes 550 in the second electrode film 502, process preparation can be easy and defects that can occur while forming the injection holes 550 in the second electrode film 502 can be reduced.

FIG. 5B is a cross-sectional view showing a fluid resistance based on a movement direction of fluid when the sealing agent 540 is injected into the sealing portion 530 of the viewing-angle adjustment member 500 based on a cutting line II-II' of FIG. 5A in the first embodiment.

Referring to FIG. 5B, the first electrode film 501 and the second electrode film 502 can define a space of the sealing portion 530. The injection hole 550 is formed in the second electrode film 502. As the sealing agent 540 is injected through the injection hole 550 from the sealing agent injection nozzle 800 to the space, the sealing agent 540 can move in a direction from a left side to a right side of the sealing portion 530. In this regard, based on a fluid pressure loss formula, a flow rate of the sealing agent can vary based on a length of the fluid channel, a coefficient of friction loss, and a diameter of the fluid channel. An arrow opposite to a direction of the fluid movement in the sealing portion 530 indicates a magnitude and a direction of resistance to inhibit the movement of the fluid. In the embodiment as shown in FIG. 5A, it is only shown that the injection hole 550 is formed in the second electrode film 502, however, the injection hole 550 can be formed in the first electrode film 501.

Specifically, it can be identified that the larger the length of the fluid channel, and the greater the frictional force of the fluid channel, the greater a pressure loss of the fluid. Further, the greater the diameter of the fluid channel, the smaller the pressure loss of the fluid.

Referring to FIG. 5B, a plurality of arrows indicates that a small and uniform fluid resistance is applied to an area ① near to the injection hole 550. It can be identified that referring to an area ② to an area ③, the fluid resistance increases as the movement distance of the arrow increases in an area adjacent to each of the first electrode layer 101 and the second electrode layer 102 as the sealing agent 540 gradually moves to the right. This can be understood as an increase in the resistance of the fluid adjacent to the first electrode layer 101 and the second electrode layer 102 due to a friction coefficient of each of the first electrode layer 101 and the second electrode layer 102. When the sealing agent 540 moves to an area ④, the fluid resistance at a vertical center level as well as in the area adjacent to each of the first electrode layer 101 and the second electrode layer 102 can increase due to a large length of the fluid channel. This can mean that a resistance of air in the sealing portion 530 becomes greater than a pressure of the sealing agent 540 in the sealing agent injection nozzle 800 as the fluid movement distance increases. To cope with this increase in the fluid resistance, a scheme of increasing an injection pressure of the sealing agent 540 in the sealing agent injection nozzle 800 can be utilized.

<Formula of Fluid Pressure Loss>

$$\Delta P_L = \frac{f \ell u^2 r}{2gD}$$

ΔP: friction loss pressure (kgf/m²), f: friction loss coefficient, l: fluid channel (pipe) length, u: flow velocity, g: gravitational acceleration (m/sec²), D: fluid channel (pipe) diameter, r: fluid specific weight (kgf/m³)

Figure 6A:
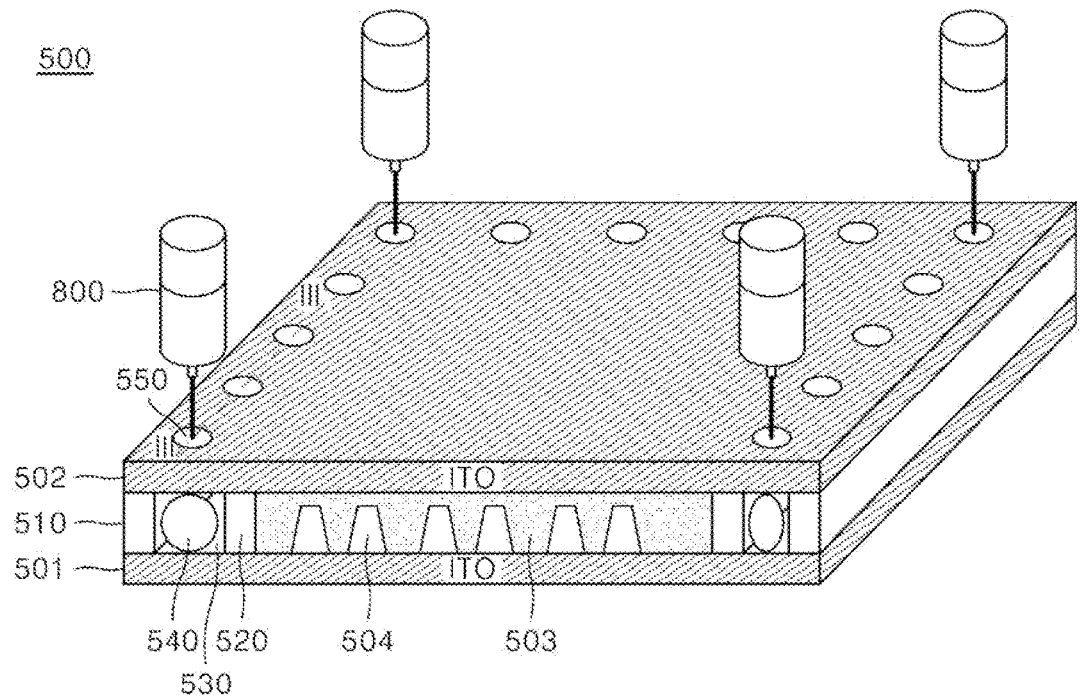
FIG. 6A and FIG. 6B are respectively a perspective view and a cross-sectional view showing an application process of a sealing agent of the viewing-angle adjustment member according to another embodiment of the present disclosure.
Figure 6B:
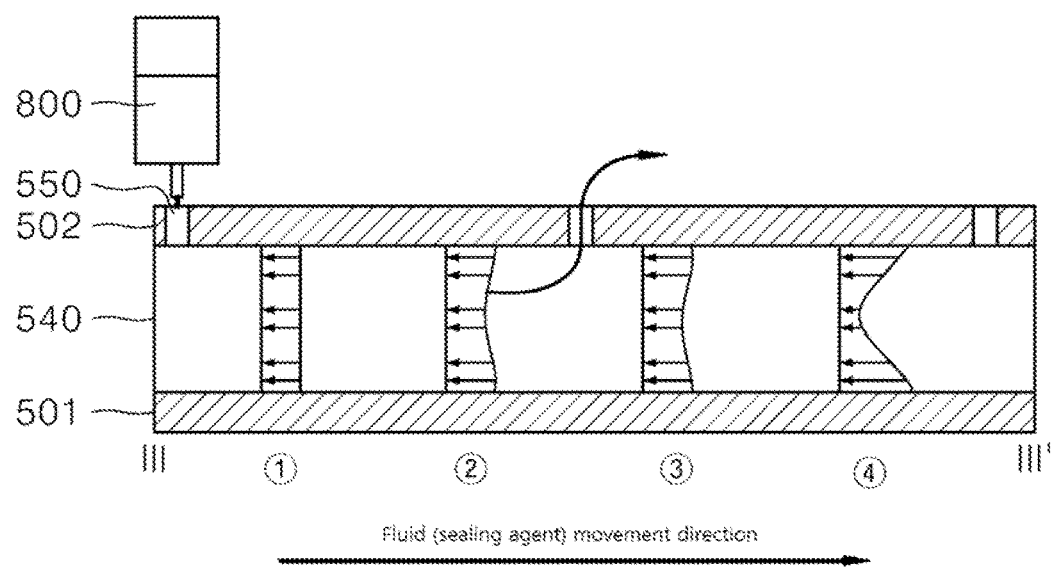

FIG. 6A and FIG. 6B are views showing a second embodiment of injecting the sealing agent 540 into the sealing portion 530 of the viewing-angle adjustment member 500. Although a cross-section is shown in which one side is cut to show the process in which the sealing agent 540 is injected into the sealing portion 530, the one side is completely sealed in the actual product, so that the sealing agent 540 or the electrochromic pattern 505 does not leak.

Referring to FIG. 6A, the partitioning wall 503, the electrochromic zone 504, the first dam 510, the second dam 520, the first electrode film 501 and the second electrode film 502 can be included in the viewing-angle adjustment member 500 as shown in FIG. 5A. Unlike the first embodiment of FIG. 5A, in the second embodiment, a plurality of injection holes 550 can be arranged in the second electrode film 502. In the second embodiment, the plurality of injection holes 550 can be defined in the second electrode film 502 so that when the sealing agent 540 is injected, air from the sealing portion 530 can escape through the holes. Thus, the sealing agent 540 can spread toward the sealing portion 530 more easily. Further, the plurality of injection holes 550 can be formed in the second electrode film 502. Thus, while the sealing agent injection nozzle 800 moves across the injection holes 550, the nozzle can inject the sealing agent 540 into the sealing portion 530 through the injection holes 550 several times.

Referring to FIG. 6A, an example in which the sealing agent 540 from the sealing agent injection nozzle 800 has been injected into a corner of the viewing-angle adjustment member 500 is shown. A corner of the viewing-angle adjustment member 500 can refer to a point where outer edge lines of the first electrode film 501 and the second electrode film 502 constituting the viewing-angle adjustment member 500 meet with each other at an angle of at least an acute angle or larger. A reason why the sealing agent 540 is injected into each of the corners of the viewing-angle adjustment member 500 is that the sealing portion 530 is bent at each of the corners, and thus, a traveling direction of the sealing agent 540 is bent, and the fluid as the sealing agent does not flow and is stagnant. When the sealing agent 540 does not flow well, the sealing agent 540 may not fill a local area. To cope with this situation, it is necessary for the sealing agent injection nozzle 800 to inject the sealing agent 540 at a higher pressure. However, when the sealing agent is injected through the injection hole 550 formed in the corner as in the second embodiment, the stagnation of the sealing agent 540 can be prevented without increasing the pressure of the sealing agent injection nozzle 800. A single sealing agent injection nozzle 800 can move across the holes. Alternatively, a sealing agent injection apparatus can include several injection nozzles 800 to inject the sealing agent through the plurality of injection holes 550 at once.

FIG. 6B is a cross-sectional view showing a fluid resistance based on the movement direction of the fluid when the sealing agent 540 is injected into the sealing portion 530 of the viewing-angle adjustment member 500 based on a cut line of FIG. 6A in the second embodiment.

Referring to FIG. 6B, the first electrode film 501 and the second electrode film 502 can define a space of the sealing portion 530. The injection hole 550 is formed in the second electrode film 502. As the sealing agent 540 is injected from the sealing agent injection nozzle 800, the sealing agent 540 can move in a direction—from the left to the right of the sealing portion 530. In this regard, based on the fluid pressure loss formula, the flow rate of the sealing agent can vary based on the length of the fluid channel, the coefficient of friction loss, and the diameter of the fluid channel. An arrow opposite to a direction of the fluid movement in the sealing portion 530 indicates a magnitude and a direction of resistance to inhibit the movement of the fluid.

Specifically, it can be identified that the larger the length of the fluid channel, and the greater the frictional force of the fluid channel, the greater a pressure loss of the fluid. Further, the greater the diameter of the fluid channel, the smaller the pressure loss of the fluid. Referring to FIG. 6B, a plurality of arrows indicates that a small and uniform fluid resistance is applied to an area ① near to the injection hole 550. Referring to an area ② to an area ③, the fluid resistance that is, the size of the arrow can increase as the sealing agent 540 gradually moves to the right. However, it can be identified that the air inside the sealing portion 530 can escape through the additional holes, such that the increase in the resistance is insignificant, compared to the first embodiment. For example, in the second embodiment, the injection hole 550 formed in the second electrode film 502 can have a function of injecting the sealing agent 540 and a function of discharging the air out of the sealing portion 530. When the fluid moves to an area ④, a phenomenon in which the fluid resistance increases in the area adjacent to each of the first electrode film 501 and the second electrode film 502 can occur.

Figure 7A:
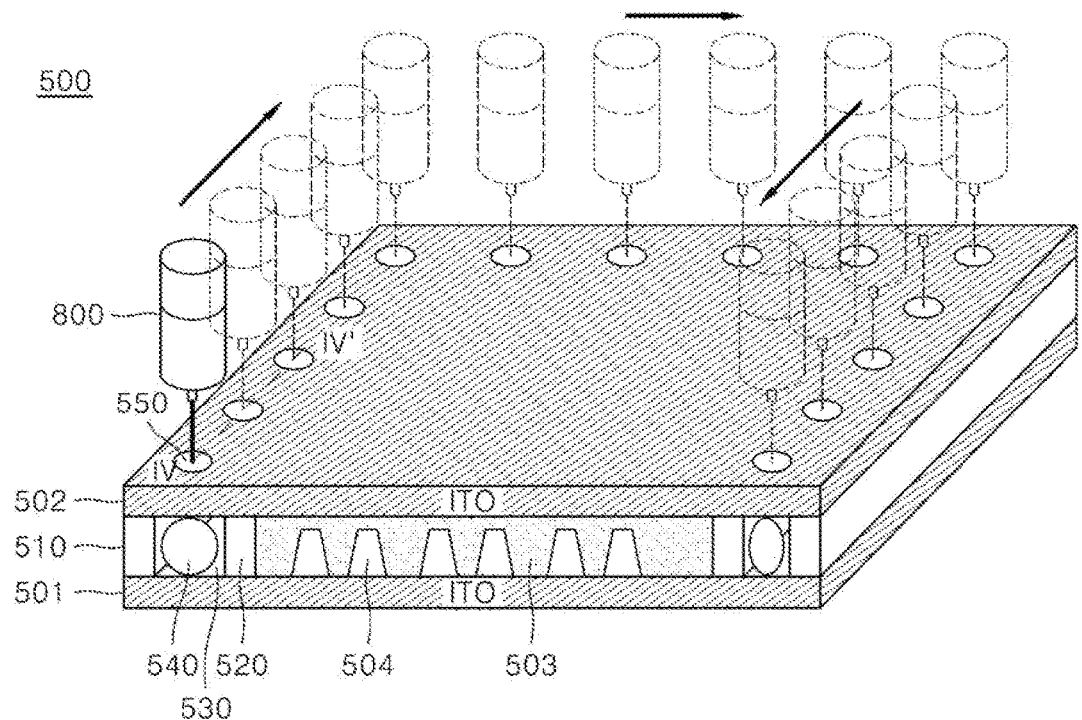
FIG. 7A and FIG. 7B are respectively a perspective view and a cross-sectional view showing an application process of a sealing agent of the viewing-angle adjustment member according to further another embodiment of the present disclosure.
Figure 7B:
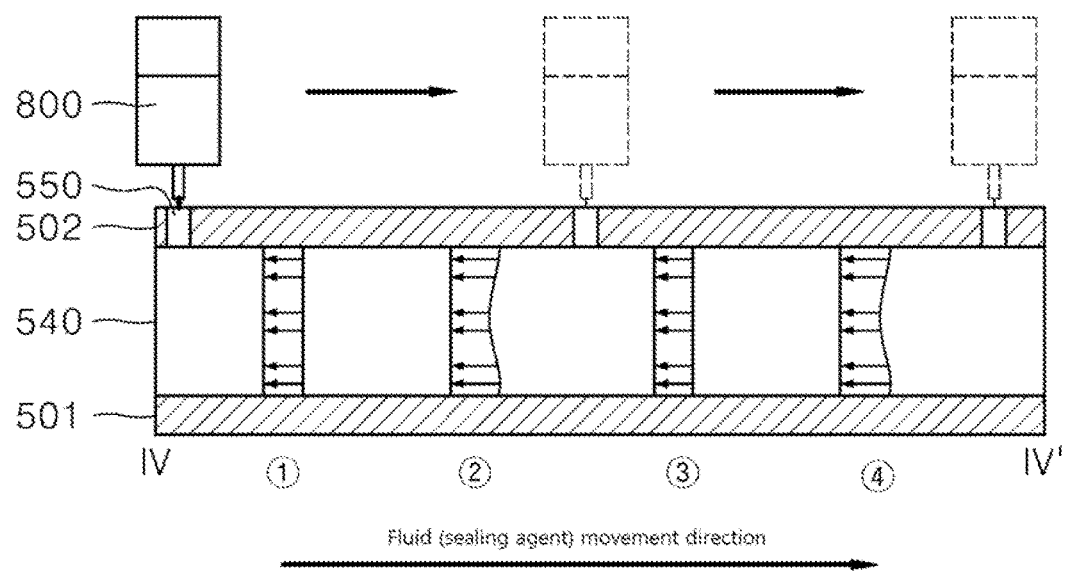

FIG. 7A and FIG. 7B are views showing a third embodiment of injecting the sealing agent 540 into the sealing portion 530 of the viewing-angle adjustment member 500. Although a cross-section is shown in which one side is cut to show the process in which the sealing agent 540 is injected into the sealing portion 530, the one side is completely sealed in the actual product, so that the sealing agent 540 or the electrochromic pattern 505 does not leak.

Referring to FIG. 7A, the partitioning wall 503, the electrochromic zone 504, the first dam 510, the second dam 520, the first electrode film 501 and the second electrode film 502 can be included in the viewing-angle adjustment member 500 as shown in FIG. 5A and FIG. 6A. Unlike the first embodiment of FIG. 5A, in the third embodiment, a plurality of injection holes 550 can be arranged in the second electrode film 502. In the third embodiment, the plurality of injection holes 550 can be defined in the second electrode film 502 so that when the sealing agent 540 is injected, air from the sealing portion 530 can escape through the holes. Thus, the sealing agent 540 can spread toward the sealing portion 530 more easily. Further, the plurality of injection holes 550 can be formed in the second electrode film 502. Thus, while the sealing agent injection nozzle 800 moves across the injection holes 550, the nozzle can inject the sealing agent 540 into the sealing portion 530 through the injection holes 550 several times. Referring to FIG. 6A, the sealing agent 540 from the sealing agent injection nozzle 800 has been injected into a corner of the viewing-angle adjustment member 500. However, in the third embodiment of FIG. 7A, the nozzle 800 can sequentially apply the sealing agent 540 to all of the injection holes 550.

Referring to FIG. 7A, it is shown that while the sealing agent injection nozzle 800 moves in one direction, the nozzle sequentially injects the sealing agent 540 into the injection holes 550 formed in a top face of the second electrode film 502 of the viewing-angle adjustment member 500. A reason why the sealing agent 540 is injected into each of the plurality of injection holes 550 formed in the viewing-angle adjustment member 500 is that in consideration of a length of the sealing portion 530 and a surface friction loss in terms of the fluid pressure loss, the fluid pressure loss can be minimized when the sealing agent 540 is injected into each of the injection holes 550. The sealing agent injection apparatus can move one sealing agent injection nozzle 800 so as to sequentially inject the sealing agent into all of the holes 550. Alternatively, the sealing agent injection apparatus can include the plurality of sealing agent injection nozzles 800, such that the sealing agent 540 can be injected into all of the injection holes 550 at the same time.

FIG. 7B is a cross-sectional view showing the fluid resistance based on the movement direction of the fluid when the sealing agent 540 is injected into the sealing portion 530 of the viewing-angle adjustment member 500 based on a cut line IV-IV' of FIG. 7A in the third embodiment.

Referring to FIG. 7B, the first electrode film 501 and the second electrode film 502 can define a space of the sealing portion 530. The injection hole 550 is formed in the second electrode film 502. As the sealing agent 540 is injected from the sealing agent injection nozzle 800, the sealing agent 540 can move in a direction—from the left to the right of the sealing portion 530. In this regard, based on the fluid pressure loss formula, the flow rate of the sealing agent can vary based on the length of the fluid channel, the coefficient of friction loss, and the diameter of the fluid channel. An arrow opposite to a direction of the fluid movement in the sealing portion 530 indicates a magnitude and a direction of resistance to inhibit the movement of the fluid.

Unlike the first and second embodiments, the sealing agent injection nozzle 800 can inject the sealing agent 540 into all of the plurality of injection holes 550 while the sealing agent injection nozzle 800 moves across all of the plurality of injection holes 550, so that the resistance of the fluid channel can be minimized.

Specifically, it can be identified that the larger the length of the fluid channel, and the greater the frictional force of the fluid channel, the greater a pressure loss of the fluid. Further, the greater the diameter of the fluid channel, the smaller the pressure loss of the fluid. Referring to FIG. 7B, a plurality of arrows indicates that a small and uniform fluid resistance is applied to an area ① near to the injection hole 550. The fluid resistance can increase by a small amount in the area ②. However, since the sealing agent injection nozzle 800 has moved to the injection hole 550 near the area ②, and injects the sealing agent 540 thereto, the fluid resistance can be minimized again in the area ③. In this regard, the fluid resistance in the area ③ can be similar to the fluid resistance in the area ①. In the third embodiment, the fluid pressure loss of the sealing portion 530 can be kept constant without large fluctuation across different zones. Thus, the sealing agent 540 can be evenly injected into an entirety of the sealing portion 530. When the sealing agent 540 flows well into the sealing portion 530 due to the continuous injection of the sealing agent 540 from the sealing agent injection nozzle 800 through the plurality of injection holes 550, an unfilled amount of the sealing agent can be reduced. Thus, there is no need to increase the injection pressure of the sealing agent injection nozzle 800. This can prevent damage to the outer walls of the sealing portion 530, the first dam 510, and the second dam 520.

Figure 8:
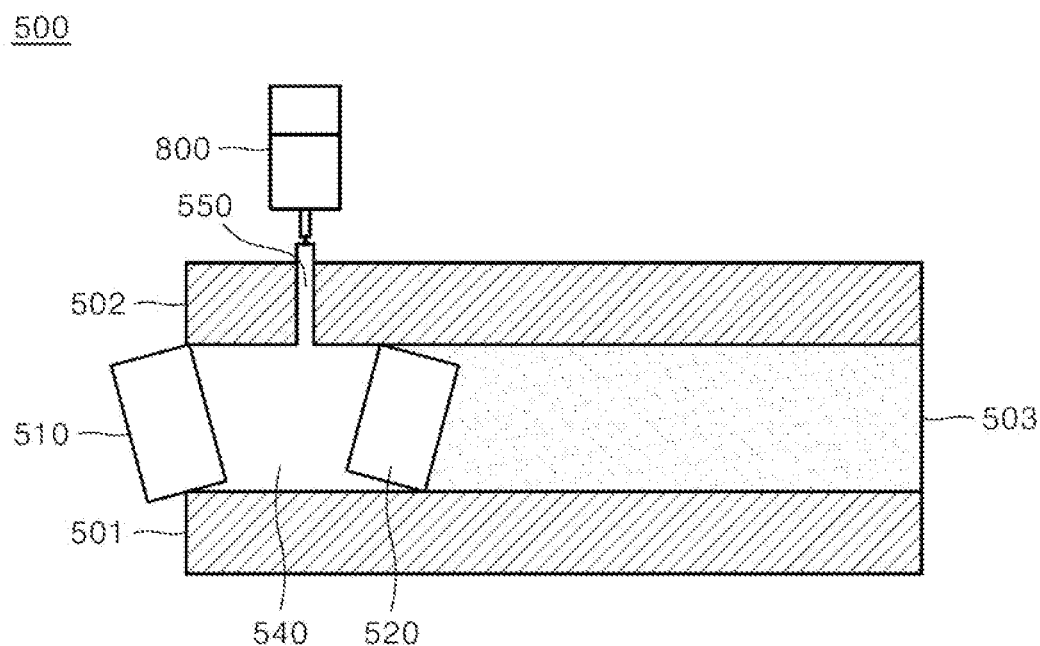
FIG. 8 is a sectional view of a sealing portion showing a case where the sealing portion of the viewing-angle adjustment member has been damaged.

FIG. 8 shows damage to the first dam 510 and the second dam 520 that can occur when the sealing agent 540 is injected into the sealing portion 530 of the viewing-angle adjustment member 500.

Referring to FIG. 8, the injection hole 550 is formed in the viewing-angle adjustment member 500. FIG. 8 shows a cross-section of the sealing agent injection nozzle 800 while the sealing agent 540 is injected into the injection hole 550. When the sealing agent 540 does not sufficiently flow in the sealing portion 530 and the pressure loss occurs, an injection pressure of the sealing agent 540 in the sealing agent injection nozzle 800 should be increased. The increase in the injection pressure of the sealing agent injection nozzle 800 increases a pressure in a structure near the injection hole 550, such that the first dam 510 constituting the sealing portion 530 is damaged. Thus, the sealing agent 540 leaks out. The second dam 520 can break and thus invade the partitioning wall 503, thereby causing a defect in which a structure of the partitioning wall 503 is broken.

Figure 9A:
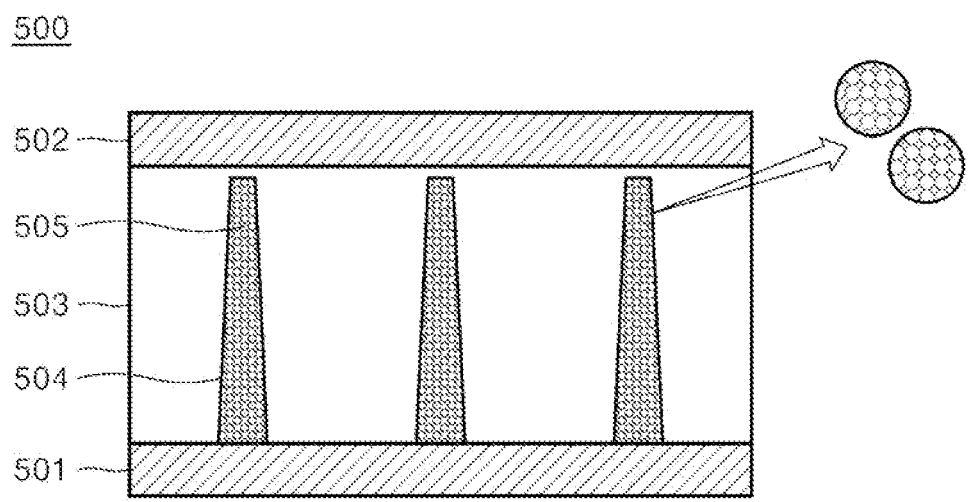
FIGS. 9A and 9B show defects that may occur in the viewing-angle adjustment member due to damage to the sealing portion of FIG. 8.
Figure 9B:
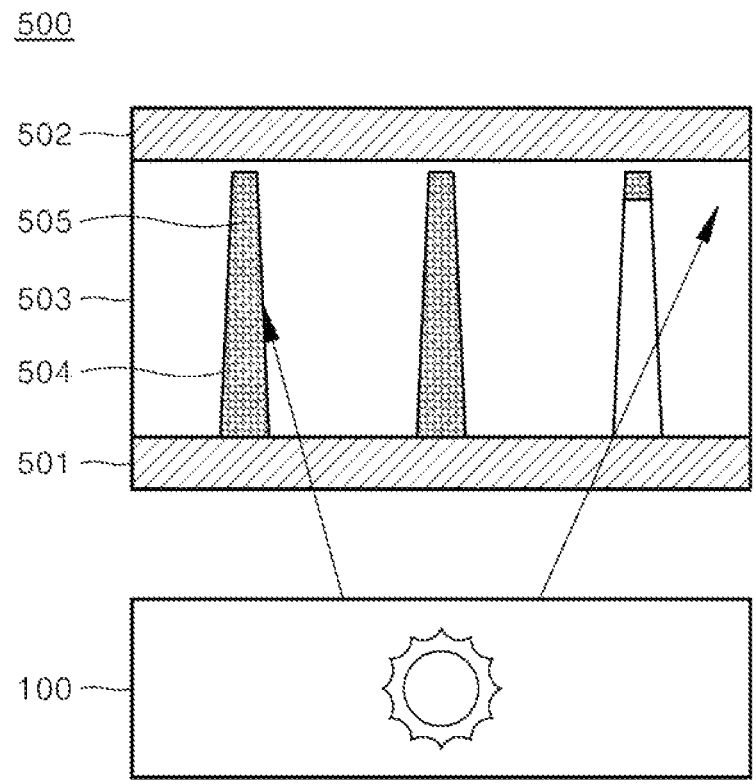

FIGS. 9A and 9B show defects due to the breakage of the first dam 510 and the second dam 520 which can occur when the sealing agent 540 is injected into the sealing portion 530 of the viewing-angle adjustment member 500.

Referring to FIG. 9A, when the second dam 502 of the sealing portion 530 is broken to cause the breakage of the partitioning wall 503, cracks can occur due to the breakage of the partitioning wall 503. Thus, a portion of the electrochromic pattern 505 can leak out of the viewing-angle adjustment member 500.

Referring to FIG. 9B, a portion of the electrochromic zone 504 can become an empty space due to leakage of the electrochromic pattern 505 due to the cracks in the partitioning wall 503 in FIG. 9A. Thus, the viewing-angle adjustment member 500 can lose the viewing-angle blocking function of the light emitting from the display panel 100, thereby causing a defect in the privacy mode.

Figure 10A:
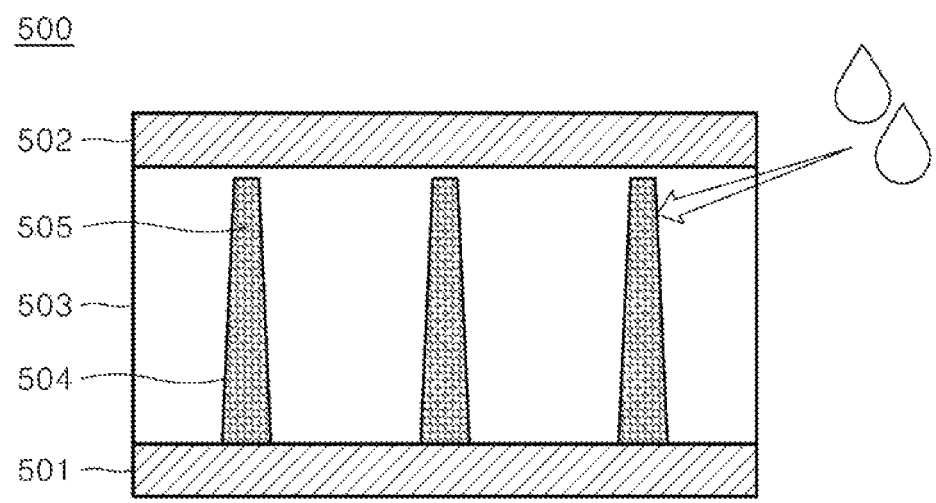
FIGS. 10A and 10B show other defects that may occur in the viewing-angle adjustment member due to breakage of the sealing portion of FIG. 8.
Figure 10B:
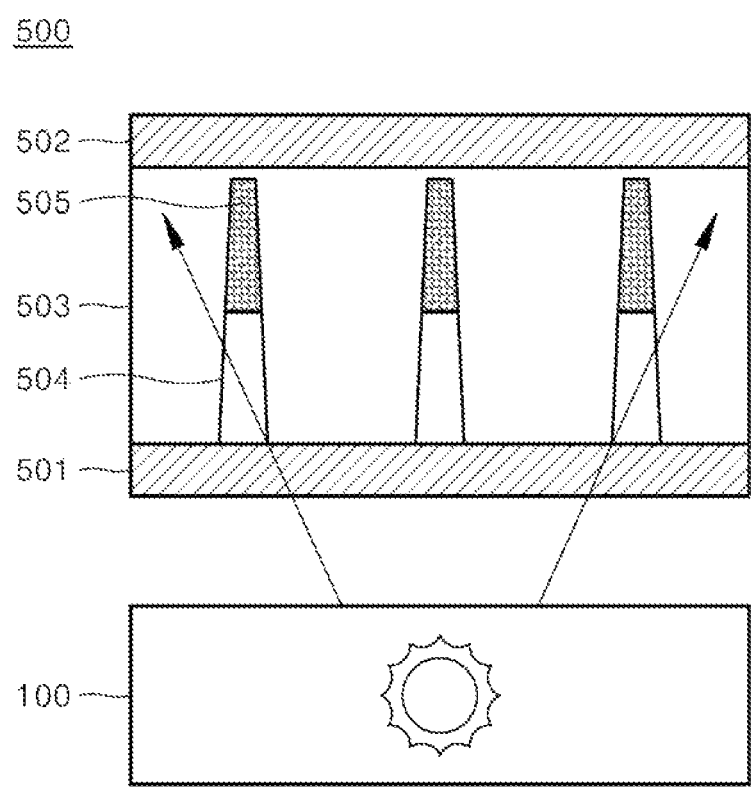

FIGS. 10A and 10B show other defects that can occur in the viewing-angle adjustment member due to breakage of the sealing portion of FIG. 8. FIGS. 10A and 10B show the defect based on the breakage of the first dam 510 and the second dam 520 that can occur when the sealing agent 540 is injected into the sealing portion 530 of the viewing-angle adjustment member 500.

Referring to FIG. 10A, when the second dam 502 of the sealing portion 530 is damaged, the partitioning wall 503 can be also broken and thus, the cracks can occur therein. Thus, the external moisture penetrates into the electrochromic zone 504 due to the cracks, thereby reducing a concentration of the electrochromic pattern 505. When the concentration of the electrochromic pattern 505 is lowered, control accuracy of the electrochromic pattern 505 is lowered in a process of switching from the privacy mode to the switching mode to the sharing mode. This mode switching failure can result in loss of the viewing-angle control ability.

Referring to FIG. 10B, when external moisture penetrates into the pattern 505 due to cracks in the partitioning wall 503 in FIG. 10A, the concentration of the electrochromic pattern 505 is biased to one side or the concentration thereof is reduced. Thus, when an electric signal is applied to between the first electrode film 501 and the second electrode film 502 for the mode switching, the viewing-angle adjustment member 500 may not perform the switching operation in a reliable manner. For example, a phenomenon in which the switching from the sharing mode to the privacy mode may or may not occur. This mode switching failure can result in loss of the viewing-angle control ability.

Figure 11:
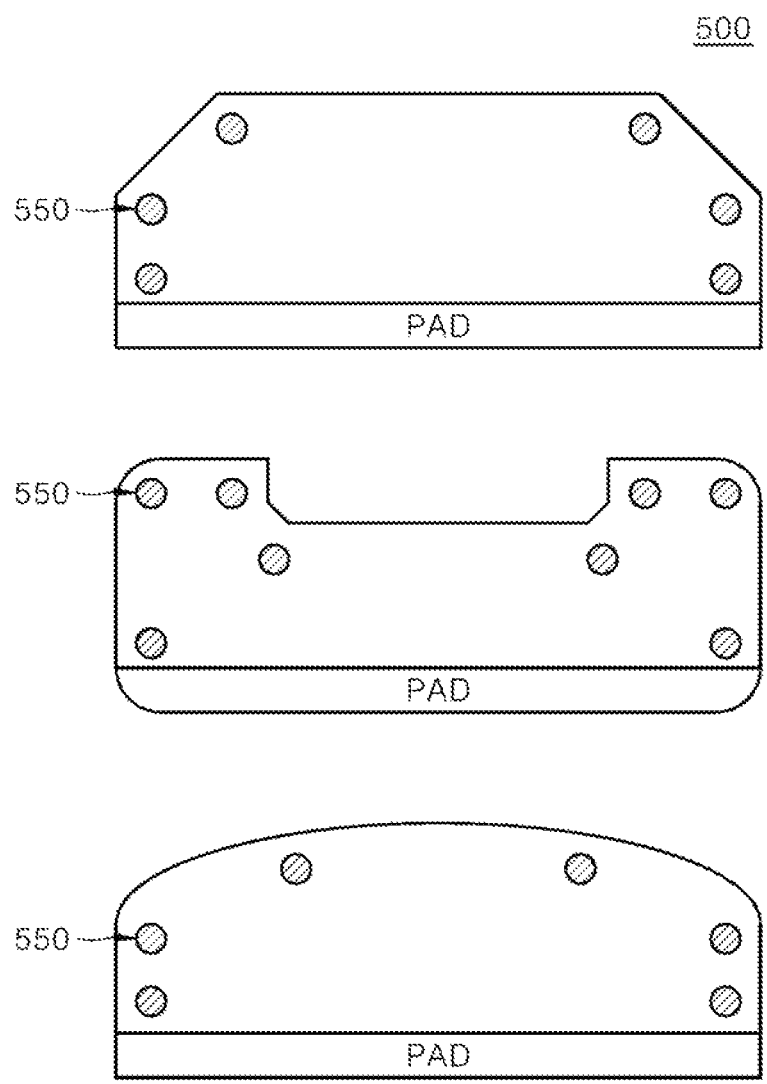
FIG. 11 shows various types of viewing-angle adjustment members corresponding to various types of display apparatus, and arrangements of sealing agent injection holes corresponding thereto, according to an embodiments of the present disclosure.

FIG. 11 shows shapes of the viewing-angle adjustment member 500 corresponding to various types of display apparatus 10, and injection holes 550 corresponding thereto according to an embodiment of the present disclosure.

Referring to FIG. 11, when the injection holes 550 are disposed in positions corresponding to corners in a corresponding manner to the arrangements of the injection holes 550 in FIG. 5A to FIG. 7A as described above according to the various embodiments of the present disclosure, an operation failure of the viewing-angle adjustment member 500 due to the dam damage and other issues discussed referring to FIGS. 8 to 10B can be addressed or prevented effectively regardless of the shape of the display apparatus 10.

Figure 12:
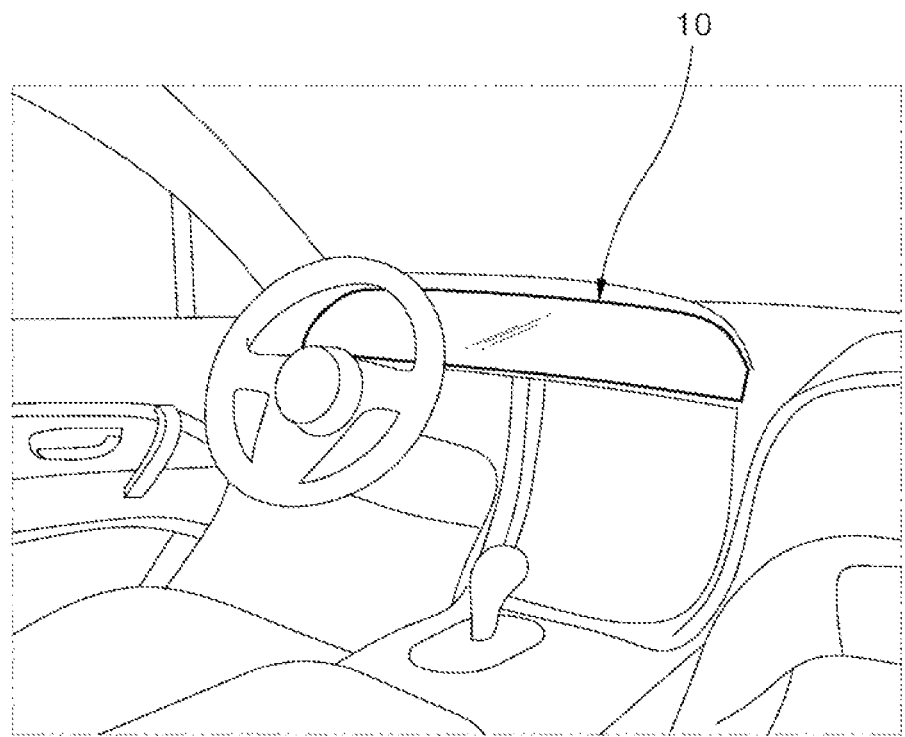
FIG. 12 is a view showing an inside of a vehicle to which a display apparatus to which an embodiment of the present disclosure is applied.

FIG. 12 is a diagram showing a structure in which a display apparatus to which an embodiment of the present disclosure is applied is disposed on a vehicle.

The display apparatus 10 having the viewing-angle adjustment member 500 can be inserted into or can be mounted on the dashboard or the center fascia of the vehicle. Thus, the driver and the passenger can utilize an infotainment system together or individually.

A display apparatus according to an embodiment of the present disclosure can be described as follows.

A first aspect of the present disclosure provides a display apparatus including a display panel, a polarizing film disposed on a top face of the display panel, a viewing-angle adjustment member disposed on a top face of the polarizing film, a touch panel disposed on a top face of the viewing-angle adjustment member, and a heat dissipation plate attached to a bottom face of the display panel, wherein the viewing-angle adjustment member includes a first electrode film, a second electrode film, and an electrochromic zone disposed between the first electrode film and the second electrode film, wherein an electrochromic pattern is disposed in the electrochromic zone.

In one implementation of the first aspect, the viewing-angle adjustment member further includes a first dam and a second dam disposed between the first electrode film and the second electrode film.

In one implementation of the first aspect, the first dam is closer to an outermost edge of the viewing-angle adjustment member than the second dam is, wherein the first dam and the second dam are spaced apart from each other to define a sealing portion therebetween.

In one implementation of the first aspect, at least one injection hole is formed in the first electrode film or the second electrode film.

In one implementation of the first aspect, the injection hole is formed at a position corresponding to a position of the sealing portion.

In one implementation of the first aspect, the sealing agent is filled into the sealing portion through the injection hole.

In one implementation of the first aspect, the injection hole is disposed adjacent to a corner at which outer edge lines of the first electrode film or the second electrode film meet each other.

In one implementation of the first aspect, each of the first electrode film and the second electrode film includes a substrate and a transparent electrode disposed on at least one face of the substrate.

In one implementation of the first aspect, the electrochromic pattern includes a carbon material.

In one implementation of the first aspect, a distribution area of the electrochromic pattern across the electrochromic zone increases or decreases based on a polarity of electricity applied to between the first electrode film and the second electrode film.

A second aspect of the present disclosure provides a display apparatus including a display panel, a polarizing film disposed on a top face of the display panel, a viewing-angle adjustment member disposed on a top face of the polarizing film, and a touch panel disposed on a top face of the viewing-angle adjustment member, wherein the viewing-angle adjustment member includes a first electrode film, a second electrode film, a first dam and a second dam disposed between the first electrode film and the second electrode film, and an electrochromic zone disposed between the first electrode film and the second electrode film, wherein an electrochromic pattern is disposed in the electrochromic zone.

In one implementation of the second aspect, the first dam is closer to an outermost edge of the viewing-angle adjustment member than the second dam is, wherein the first dam and the second dam are spaced apart from each other to define a sealing portion therebetween.

In one implementation of the second aspect, at least one injection hole is formed in the first electrode film or the second electrode film.

In one implementation of the second aspect, the injection hole is formed at a position corresponding to a position of the sealing portion.

In one implementation of the second aspect, the sealing agent is filled into the sealing portion through the injection hole.

In one implementation of the second aspect, the at least one injection hole is disposed adjacent to a corner at which outer edge lines of the first electrode film or the second electrode film meet each other.

In one implementation of the second aspect, each of the first electrode film and the second electrode film includes a substrate and a transparent electrode disposed on at least one face of the substrate.

In one implementation of the second aspect, the electrochromic pattern includes a carbon material.

In one implementation of the second aspect, a distribution area of the electrochromic pattern across the electrochromic zone increases or decreases based on a polarity of electricity applied to between the first electrode film and the second electrode film.

The features, the structures, the effects, etc. as described in the examples of the present application as described above are included in at least one example of the present disclosure, and are not necessarily limited to only one example. Furthermore, the features, the structures, the effects, etc. illustrated in at least one example of the present disclosure can be combined with each other or modified in other examples by those of ordinary skill in the art to which the present application belongs. Therefore, the combinations and the modifications should be interpreted as being included in the scope of the present disclosure.

The present disclosure as described above is not limited to the above-described embodiments and the accompanying drawings. It will be apparent to those of ordinary skill in the technical field to which the present disclosure belongs that various substitutions, modifications and changes can be made within the scope not departing from the technical ideas of the present disclosure. Therefore, the scope of the present disclosure is indicated by the following claims, and all changes or modifications derived from the meaning and scope of the claims and their equivalent concepts should be construed as being included in the scope of the present disclosure.

What is claimed is:

1. A display apparatus comprising:
a display panel;
a polarizing film disposed on the display panel; and
a viewing-angle adjustment member disposed on the display panel,
wherein the viewing-angle adjustment member includes:
a first electrode film;
a second electrode film; and
an electrochromic zone disposed between the first electrode film and the second electrode film,
wherein an electrochromic pattern is disposed in the electrochromic zone,
wherein at least one injection hole is disposed in the first electrode film or the second electrode film, and
wherein the at least one injection hole is disposed at a corner at which outer edge lines of the first electrode film or the second electrode film meet each other.

2. The display apparatus of claim 1, wherein the viewing-angle adjustment member further includes a first dam and a second dam disposed between the first electrode film and the second electrode film, and the first dam and the second dam are disposed outside of the electrochromic zone.

3. The display apparatus of claim 2, wherein the first dam and the second dam are spaced apart from each other to define a sealing portion therebetween.

4. The display apparatus of claim 3, wherein the at least one injection hole is disposed at a position corresponding to a position of the sealing portion.

5. The display apparatus of claim 4, further comprising a sealing agent filled into the sealing portion.

6. The display apparatus of claim 5, wherein the at least one injection hole includes a plurality of injection holes, and the sealing agent is injected into the plurality of injection holes by one or more of sealing agent injection nozzles.

7. The display apparatus of claim 1, wherein each of the first electrode film and the second electrode film includes a substrate and a transparent electrode disposed on at least one face of the substrate.

8. The display apparatus of claim 1, wherein the electrochromic pattern includes a carbon material.

9. The display apparatus of claim 1, wherein a distribution area of the electrochromic pattern across the electrochromic zone increases or decreases based on a polarity of electricity applied to between the first electrode film and the second electrode film.

10. The display apparatus of claim 1, wherein the viewing-angle adjustment member further comprises a partitioning wall to partition the electrochromic zone.

11. The display apparatus of claim 1, wherein the electrochromic pattern is evenly distributed in the electrochromic zone.

12. A vehicle, comprising the display apparatus according to claim 1.

13. A display apparatus comprising:
a display panel;
a polarizing film disposed on the display panel; and
a viewing-angle adjustment member disposed on the display panel,
wherein the viewing-angle adjustment member includes:
a first electrode film;
a second electrode film;
a first dam and a second dam disposed between the first electrode film and the second electrode film; and
an electrochromic zone disposed between the first electrode film and the second electrode film,
wherein an electrochromic pattern is disposed in the electrochromic zone,
wherein at least one injection hole is disposed in the first electrode film or the second electrode film, and
wherein the at least one injection hole is disposed at a corner at which outer edge lines of the first electrode film or the second electrode film meet each other.

14. The display apparatus of claim 13, wherein the first dam and the second dam are disposed outside of the electrochromic zone, and
wherein the first dam and the second dam are spaced apart from each other to define a sealing portion therebetween.

15. The display apparatus of claim 14, wherein the least one injection hole is disposed at a position corresponding to a position of the sealing portion.

16. The display apparatus of claim 15, further comprising a sealing agent filled into the sealing portion.

17. The display apparatus of claim 16, wherein the least one injection hole includes a plurality of injection holes, and the sealing agent is injected into the plurality of injection holes by one or more of sealing agent injection nozzles.

18. The display apparatus of claim 13, wherein each of the first electrode film and the second electrode film includes a substrate and a transparent electrode disposed on at least one face of the substrate.

19. The display apparatus of claim 13, wherein the electrochromic pattern includes a carbon material.

20. The display apparatus of claim 13, wherein a distribution area of the electrochromic pattern across the electrochromic zone increases or decreases based on a polarity of electricity applied to between the first electrode film and the second electrode film.

21. The display apparatus of claim 13, wherein the viewing-angle adjustment member further comprises a partitioning wall to partition the electrochromic zone.

22. The display apparatus of claim 13, wherein the electrochromic pattern is evenly distributed in the electrochromic zone.

* * * * *